(12) United States Patent
Hong et al.

(10) Patent No.: US 8,481,102 B2
(45) Date of Patent: Jul. 9, 2013

(54) TEMPERATURE CONTROL METHOD FOR CHEMICAL VAPOR DEPOSITION APPARATUS

(75) Inventors: Sung Jae Hong, Seongnam (KR); Hong Won Lee, Yongin (KR); Seok Man Han, Seongnam (KR); Joo Jin, Yongin (KR)

(73) Assignee: LIGADP Co., Ltd., Seongnam (KR)

( * ) Notice: Subject to any disclaimer, the term of this patent is extended or adjusted under 35 U.S.C. 154(b) by 380 days.

(21) Appl. No.: 12/881,253

(22) Filed: Sep. 14, 2010

(65) Prior Publication Data

US 2011/0143016 A1 Jun. 16, 2011

(30) Foreign Application Priority Data

Dec. 16, 2009 (KR) .................. 10-2009-0125296

(51) Int. Cl.
*C23C 16/52* (2006.01)
(52) U.S. Cl.
USPC .... 427/8; 427/248.1; 427/255.28; 427/255.5; 118/666; 118/715
(58) Field of Classification Search
USPC ................................. 427/8, 248.1
See application file for complete search history.

(56) References Cited

U.S. PATENT DOCUMENTS 6,878,395 B2 * 4/2005 Kaeppeler .................. 427/8
2010/0111511 A1 * 5/2010 Merry et al. ................ 392/411

FOREIGN PATENT DOCUMENTS

KR 10-2001-0076352 8/2001
KR 10-2005-0102206 10/2005

* cited by examiner

*Primary Examiner* — David Turocy
(74) *Attorney, Agent, or Firm* — Occhiuti Rohlicek & Tsao LLP

(57) ABSTRACT

Provided is a method in which a difference between a surface temperature of a susceptor and a surface temperature of a substrate is accurately grasped without using a complicated high-priced equipment. A temperature control method for a chemical vapor deposition apparatus includes detecting a rotation state of a susceptor on which a substrate is accumulated on a top surface thereof, measuring a temperature of the top surface of the susceptor, calculating a temperature distribution of the top surface of the susceptor, based on the detected rotation state and the measured temperature, and controlling the temperature of the top surface of the susceptor, based on the calculated temperature distribution.

12 Claims, 8 Drawing Sheets

TEMPERATURE CONTROL METHOD FOR CHEMICAL VAPOR DEPOSITION APPARATUS

CROSS-REFERENCE TO RELATED PATENT APPLICATION

This application claims the benefit of Korean Patent Application No. 10-2009-0125296, filed on Dec. 16, 2009, in the Korean Intellectual Property Office, the disclosure of which is incorporated herein in its entirety by reference.

BACKGROUND OF THE INVENTION

1. Field of the Invention

The present invention relates to a temperature control method for a substrate processing apparatus, and more particularly, to a temperature control method for a chemical vapor deposition apparatus.

2. Description of the Related Art

Chemical vapor deposition apparatuses are apparatuses in which a processing gas is supplied into a chamber to deposit a thin film on a substrate within the chamber. In a thin film deposition process using such a chemical vapor deposition apparatus, uniform temperature distribution within the chamber significantly affects quality of the thin film. In particular, in case of a metal organic chemical vapor deposition (MOCVD), when a uniform temperature control is performed, a high-quality light emitting device may be obtained. To effectively control a temperature, temperature distribution on a top surface of a susceptor should be accurately grasped. As a result, a power to be applied to a heater may be accurately grasped.

In relation to the temperature distribution on the top surface of the susceptor, there is a temperature difference between a surface temperature of substrates loaded on the top surface of the susceptor and the surface temperature of the susceptor. In a related art technology, a temperature within a chamber is controlled without separating a surface temperature of a susceptor from a surface temperature of a substrate. However, to achieve more uniform temperature distribution, a difference between the surface temperatures should be measured accurately. Meanwhile, there is a problem that a very complicated and expensive apparatus should be additionally installed to accurately measure the temperature difference.

SUMMARY OF THE INVENTION

The present invention provides a temperature control method, which accurately grasps a temperature distribution of a top surface of a susceptor to achieve a uniform temperature distribution. In more particular, the present invention provides a temperature control method in which a surface temperature of a susceptor and a surface temperature of a substrate may be separated from each other and a difference of the surface temperatures may be considered.

According to an aspect of the present invention, a temperature control method for a chemical vapor deposition apparatus includes: detecting a rotation state of a susceptor on which a substrate is loaded on a top surface thereof; measuring a temperature of the top surface of the susceptor; calculating a temperature distribution of the top surface of the susceptor, based on the detected rotation state and the measured temperature; and controlling the temperature of the top surface of the susceptor, based on the calculated temperature distribution.

The rotation state in the detecting of the rotation state may include a rotation angle or rotation time of the susceptor.

The temperature distribution in the calculating of the temperature distribution may include a temperature distribution for each rotation angle or a temperature distribution for each rotation time.

The calculating of the temperature distribution may further include allotting an identifier to a section of the temperature distribution on the top surface of the susceptor, and the controlling of the temperature of the top surface of the susceptor may include comparing a temperature of a section to which the identifier selected by a user is allotted with a preset reference temperature to control the temperature of the top surface of the susceptor.

The controlling of the temperature of the top surface of the susceptor may include comparing an average temperature of a section to which the identifier selected by a user is allotted or a real-time temperature to the preset reference temperature to control the temperature of the top surface of the susceptor.

The calculating of the temperature distribution may include dividing the temperature distribution into a high-temperature section and a low-temperature section, based on a predetermined temperature.

The high-temperature section may be a section in which the measured temperature is greater by a preset ratio than an average temperature of the top surface of the susceptor, and the low-temperature section may be a section in which the measured temperature is less than by a preset ratio than the average temperature of the top surface of the susceptor.

The temperature control method may include allotting an identifier to each of the high-temperature section and the low-temperature section, and the controlling of the temperature of the top surface of the susceptor may include comparing the temperature of the section to which the identifier selected by a user is allotted with the preset reference temperature to control the temperature of the top surface of the susceptor.

The calculation of the temperature distribution of the top surface of the susceptor may include excluding a temperature change section of a circumference portion of the substrate from the high-temperature section or the low-temperature section.

The temperature change section may be a section having a temperature change greater than a preset value.

The temperature change section may be a section in which an average temperature change during a preset time is greater than a preset temperature change.

The calculation of the temperature distribution of the top surface of the susceptor may include matching a susceptor section in substrate displacement information with the high-temperature section based on the inputted substrate displacement information and matching a substrate section in the substrate displacement information with the low-temperature section.

The matching of the substrate section may include matching the substrate section with the low-temperature section to minimize a deviation between an angle of a central portion or a boundary portion of the substrate section and an angle of a central portion or a boundary portion of the low-temperature section.

The matching of the susceptor section may include matching the susceptor section with the high-temperature section to minimize a deviation between an angle of a central portion or a boundary portion of the susceptor section and an angle of a central portion or a boundary portion of the high-temperature section.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
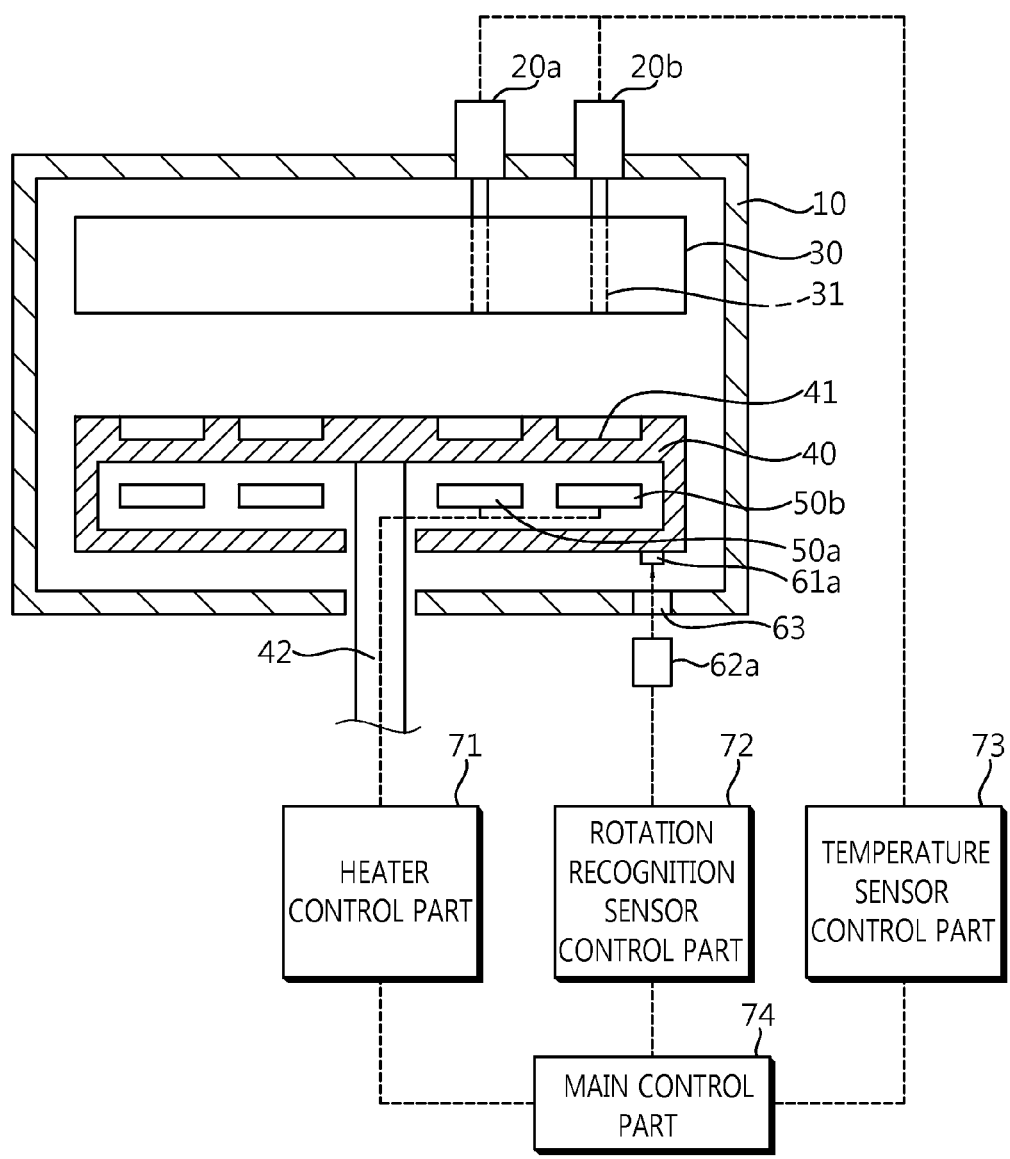
FIG. 1 is a schematic sectional view of a chemical vapor deposition apparatus according to an exemplary embodiment of the present invention.

The present invention will now be described more fully with reference to the accompanying drawings, in which exemplary embodiments of the present invention are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions may be exaggerated for clarity of illustration. Like reference numerals in the drawings denote like elements.

FIG. 1 is a schematic sectional view of a chemical vapor deposition apparatus according to an exemplary embodiment of the present invention.

Referring to FIG. 1, a chemical vapor deposition apparatus according to the exemplary embodiment includes a chamber 10, a susceptor 40, a gas supply part 30, heaters 50a and 50b, temperature sensors 20a and 20b, a rotation recognition mark 61a, a rotation recognition sensor 62a, a heater control part 71, a rotation recognition sensor control part 72, a temperature sensor control part 73, and a main control part 74.

In case where a metal organic chemical vapor deposition (MOCVD) apparatus is used as the chemical vapor deposition apparatus according to the exemplary embodiment, a group III gas and a group V gas are may be injected from the gas supply part 30 onto a substrate placed in a substrate pocket 41 of a top surface of the susceptor 40.

The temperature sensors 20a and 20b may be disposed on an upper side of the chamber 10 to detect a temperature of the top surface of the susceptor 40. Alternatively, if a temperature of the substrate loaded on the susceptor 40 is adequately measurable, the temperature sensors 20a and 20b may be disposed on lateral surfaces or a bottom surface of the susceptor 40.

A pyrometer that uses light reflected from an object to measure a temperature in a noncontact fashion may be used as the temperature sensors 20a and 20b. For example, a pyrometer that measures a surface temperature with a frequency of about 700 Hz may be used as the temperature sensors 20a and 20b.

Since the gas supply part 30 is disposed between the temperature sensors 20a and 20b and the susceptor 40, a through-hole 31 may be formed at the gas supply part 30 to receive light reflected from the top surface of the susceptor 40.

A plurality of temperatures sensors 20a and 20b may be arranged in a radius direction with respect to a rotation shaft 42 of the susceptor 40. Thus, a temperature distribution depending on a distance from the rotation shaft 42 of the susceptor 40 may be detected.

A substrate on which a thin film should be formed on a top surface thereof is placed in the substrate pocket 41. The substrate pocket 41 may be provided in plurality on the top surface of the susceptor 40.

A plurality of heaters 50a and 50b, each having a doughnut shape and heating the susceptor 40, may be provided inside the susceptor 40. The heater control part 71 may individually control the plurality of heaters 50a and 50b. That is, the heater control part 71 may uniformly or proportionally or separately control the temperatures of the plurality of heaters 50a and 50b.

The susceptor 40 may be rotated about the rotation shaft 42 at a high speed, but the heaters 50a and 50b may be maintained in a static state.

The rotation recognition mark 61a may be placed on a bottom surface of the susceptor 40, and the rotation recognition sensor 62a for detecting the rotation recognition mark 61a may be placed outside the chamber 10.

The rotation recognition mark 61a is not limited to the foregoing position. For example, the rotation recognition mark 61a may be disposed on another position at which the rotation recognition mark 61a is integrally rotated with the susceptor 40. The rotation recognition mark 61a may include a concave part and a convex part and may further include a reflection part.

The rotation recognition mark 61a is not limited to a specific configuration. For example, the rotation recognition mark 61a may be formed of various shapes and materials which are recognizable by the rotation recognition sensor 62a according to a sensing method of the rotation recognition sensor 62a.

There are various methods for detecting the rotation recognition mark. As one exemplary example, a method in which whether the rotation recognition mark 61a passes over the rotation recognition sensors 61a and 62a is grasped by detecting a process in which light irradiated from the rotation recognition sensor 62a passes a transparent window 63 to reach the rotation recognition mark 61a, and then, the light reflected from the rotation recognition mark 61a passes again the transparent window 63 to reach the rotation recognition sensor 62a. That is, according to the method, a surface configuration change of the bottom surface of the susceptor 40 is detected.

Figure 2:
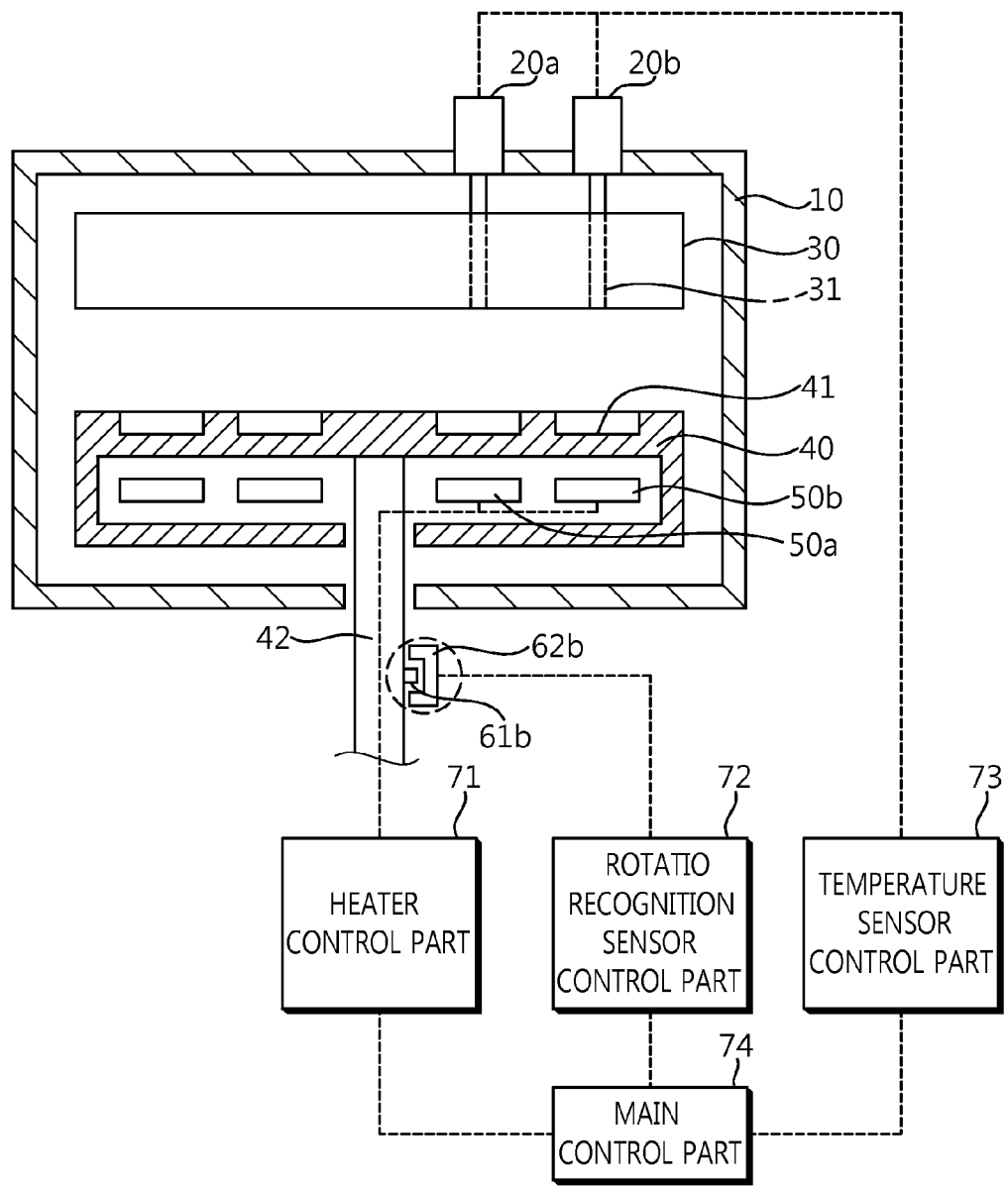
FIG. 2 is a schematic sectional view of a chemical vapor deposition apparatus according to another exemplary embodiment of the present invention.

FIG. 2 is a schematic sectional view of a chemical vapor deposition apparatus according to another exemplary embodiment of the present invention.

Figure 3:
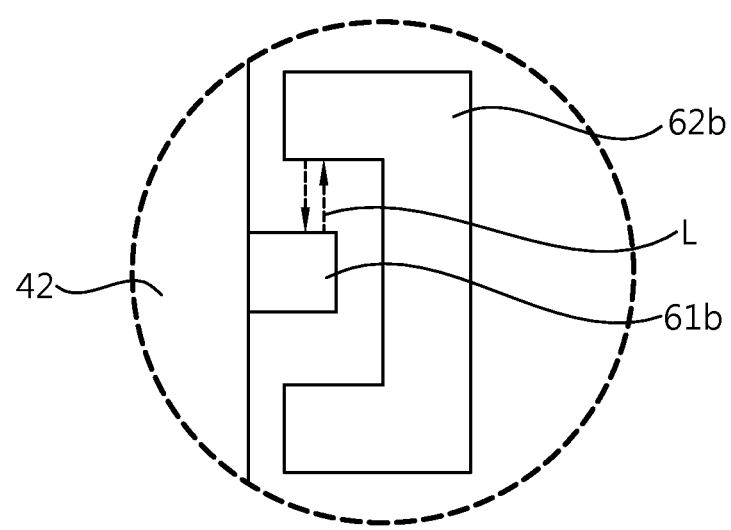
FIG. 3 is an enlarged view of a rotation recognition mark and a rotation recognition sensor.

FIG. 3 is an enlarged view of a rotation recognition mark and a rotation recognition sensor. For convenience, parts similar to those of the foregoing embodiment will be indicated by the same reference numerals.

Referring to FIG. 2, a rotation recognition sensor 62b may be disposed adjacent to a rotation shaft 42 of a susceptor 40. The rotation recognition sensor 62b has one side from which light L is irradiated and the other side in which the irradiated light is detected. A rotation recognition mark 61*b* may be disposed on the rotation shaft 42 of the susceptor 40. The rotation recognition sensor 62*b* may detect the moment when the rotation recognition mark 61*b* screens the light L while passing over the rotation recognition sensor 62*b*.

Figure 4:
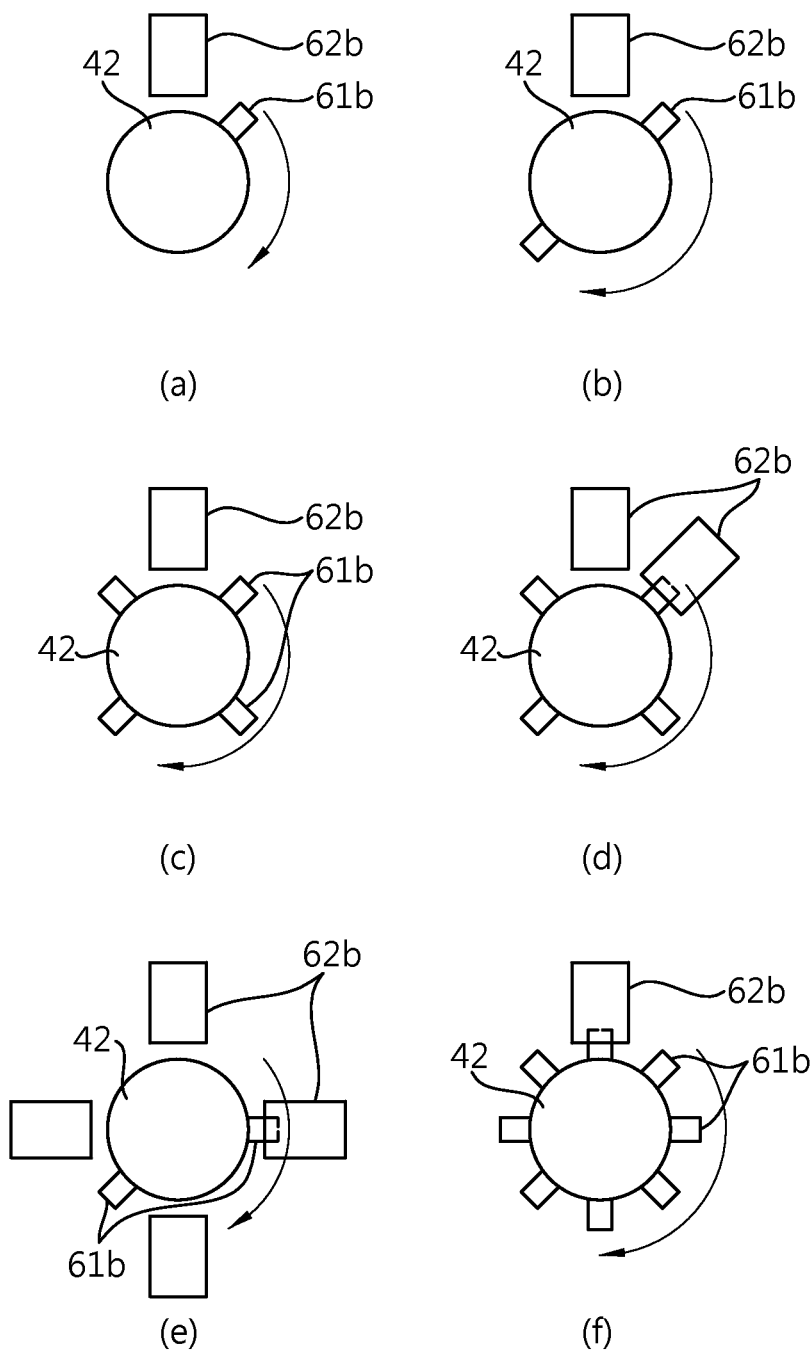
FIG. 4 is a schematic plan view illustrating operations of a rotation recognition mark and a rotation recognition sensor according to another exemplary embodiment of the present invention.

FIG. 4 is a schematic plan view illustrating operations of a rotation recognition mark and a rotation recognition sensor according to another exemplary embodiment of the present invention.

Referring to FIG. 4A, one rotation recognition mark 61*b* is provided. In this case, the rotation recognition sensor 62*b* may detect a rotation state every 360 degrees. Here, the shorter period during which the rotation state is detected, the more accurately detected the rotation state is. Thus, a plurality of rotation recognition marks may be radially disposed around the rotation shaft of the susceptor.

Referring to FIG. 4B, two rotation recognition marks 61*b* are provided. In this case, the rotation recognition sensor 62*b* may detect the rotation state every 180 degrees.

Referring to FIG. 4C, four rotation recognition marks 61*b* are provided. In this case, the rotation recognition sensor 62*b* may detect the rotation state every 90 degrees.

Referring to FIG. 4D, four rotation recognition marks 61*b* and two rotation recognition sensors 62*b* are provided. In this case, the rotation recognition sensors 62*b* may detect the rotation state every 45 degrees. When compared to FIG. 4(*a*), since the period during which the rotation state is detected is shorter, the rotation state may be more accurately detected even though the susceptor is rotated at a relatively low speed.

Referring to FIG. 4E, two rotation recognition marks 61*b* and four rotation recognition sensors 62*b* are provided. In this case, the rotation recognition sensors 62*b* may detect the rotation state every 45 degrees.

Referring to FIG. 4F, eight rotation recognition marks 61*b* and one rotation recognition sensor 62*b* are provided. In this case, the rotation recognition sensor 62*b* may detect the rotation state every 45 degrees. When the plurality of rotation recognition marks is densely arranged, the rotation state may be more accurately detected even though the susceptor is rotated at a relatively low speed.

Figure 5:
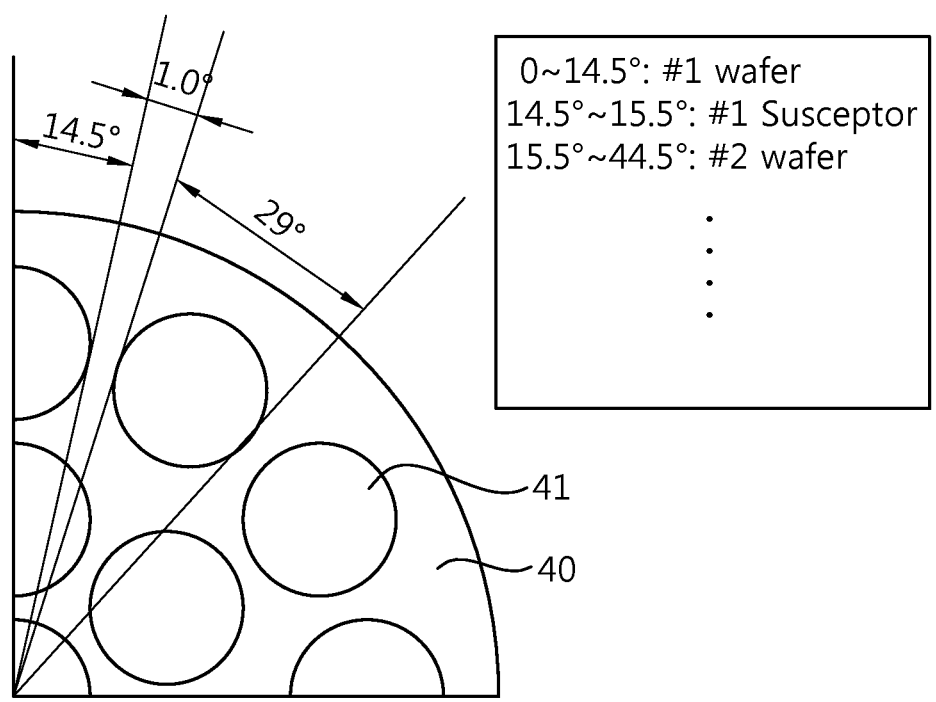
FIG. 5 is a view illustrating preset substrate placement angle information and a portion of a top surface of a susceptor.

FIG. 5 is a view illustrating preset substrate placement angle information and a portion of a top surface of a susceptor.

Referring to FIG. 5, a process which sets an identifier (ID) for each of sections to identify each susceptor section and substrate section is illustrated. When based on a line connecting a center of a substrate pocket 41 on which a substrate is placed first on the outermost position of the susceptor to a center of the susceptor, the entire section may be divided into twelve substrate sections and twelve susceptor sections (for example, a $1^{st}$ substrate section is set in the range of 0° to 14.5°, a $1^{st}$ susceptor section is set in the range of 14.5° to 15.5°, a $2^{nd}$ substrate section is set in the range of 15.5° to 44.5°, a $2^{nd}$ susceptor section is set in the range of 44.5° to 45.5°, etc.). The identifier ID is not limited to Arabic numerals. For example, the identifier ID may be set to alphabets or other characters. Similarly, substrate sections and susceptor sections, which are disposed inwardly from the center of the susceptor may be set in a manner similar to the previous method.

As described above, substrate placement angle information may be calculated by matching each of the divided susceptor sections and substrate sections with the identifier ID to be input into a main body.

Figure 6:
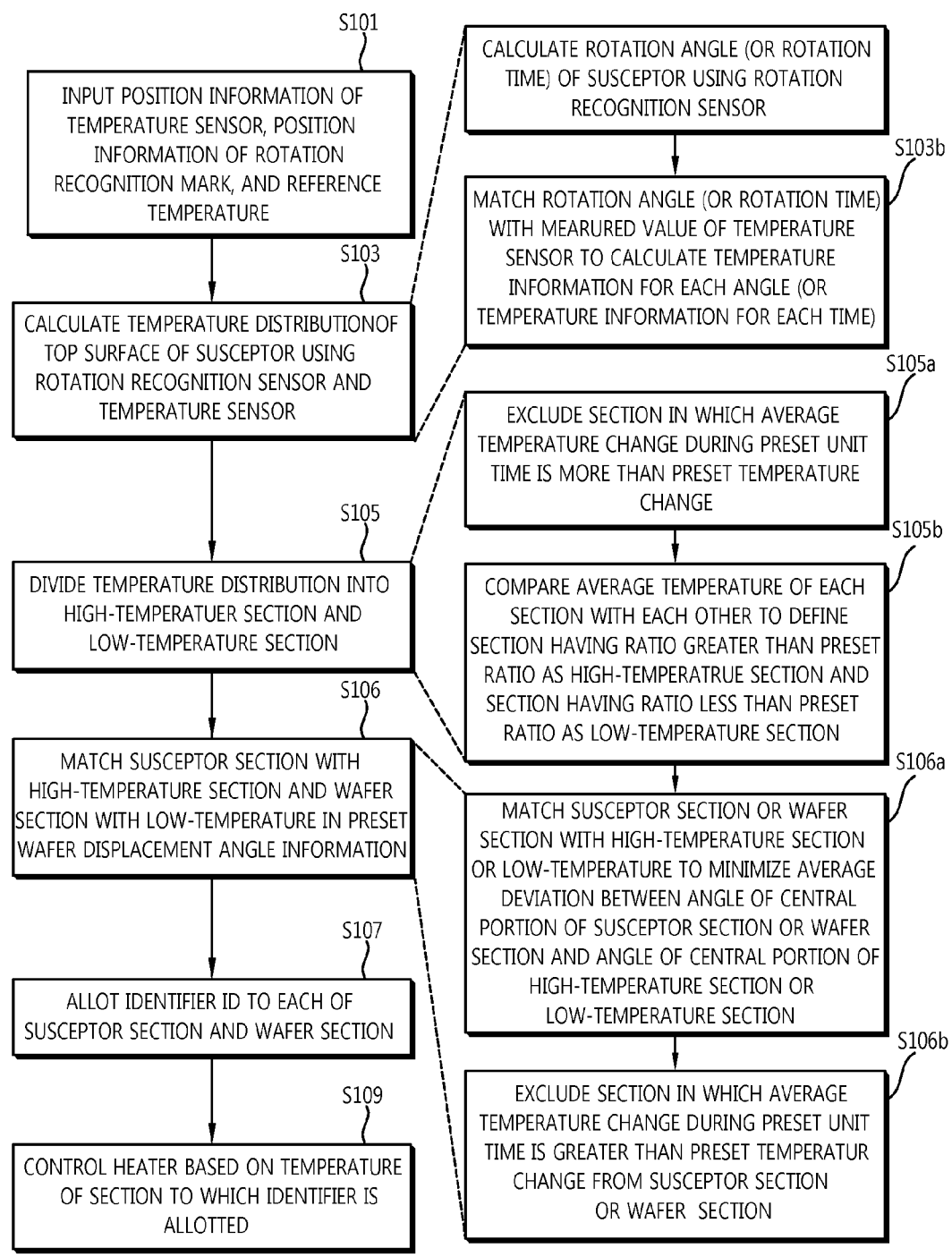
FIG. 6 is a flowchart illustrating a temperature control method for a chemical vapor deposition apparatus.

FIG. 6 is a flowchart illustrating a temperature control method for a chemical vapor deposition apparatus.

Referring to FIG. 6, first, a process in which position information of a temperature sensor, position information of a rotation recognition mark, or a reference temperature is inputted may be performed in operation S101.

Next, a process for calculating temperature distribution of a top surface of a susceptor using a rotation recognition sensor and the temperature sensor may be performed in operation S103.

There are various methods for performing the operation S103. As one example, a rotation angle (or rotation time) of the susceptor may be calculated using the rotation recognition sensor in operation S103*a*, and the rotation angle (or rotation time) may be matched with a measured value of the temperature sensor to find out the temperature distribution for each angle (or temperature distribution for each time) in operation S103*b*. For example, when four rotation recognition marks are provided, the susceptor may be rotated at about 90 degrees during a period in which the rotation recognition mark is detected. As a result, a rotation speed and a rotation angle during the elapsed time may be calculated.

Figure 7:
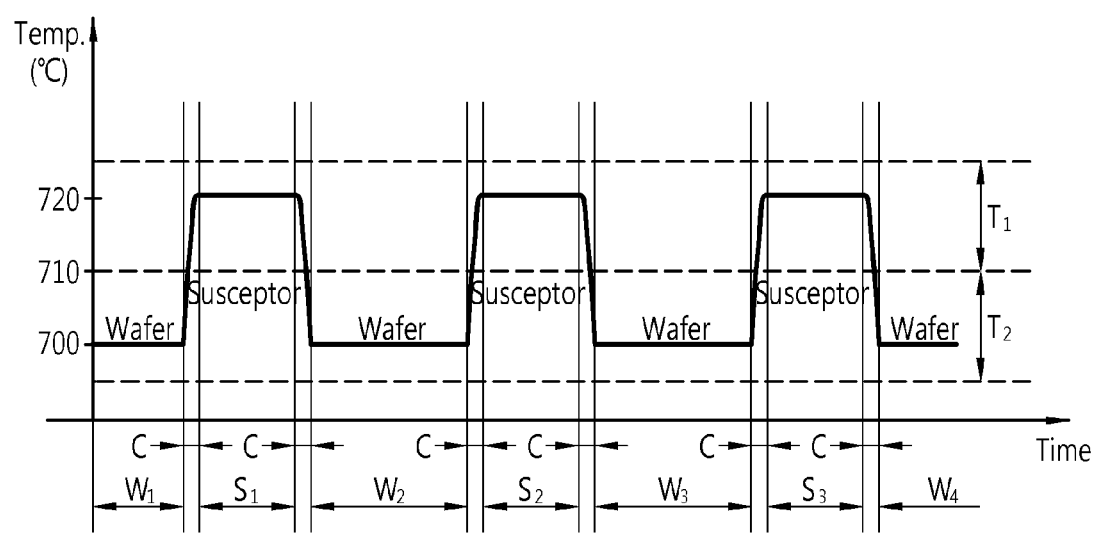
FIG. 7 is a graph illustrating an example of a measured value of a temperature sensor depending on a time.

FIG. 7 is a graph illustrating an example of a measured value of a temperature sensor depending on a time.

Referring to FIG. 7, generally, substrate sections W1, W2, W3, and W4 have temperatures less than those of susceptor sections 51, S2, and S3. A temperature change section c in which a temperature is not constant occurs on a circumference portion of the substrate. In the operation S103*b*, the temperature distribution shown in FIG. 7 may be found out.

Referring again to FIG. 6, a process (S105) for dividing the temperature distribution into a high-temperature section and a low-temperature section may be performed.

There are various methods for dividing the temperature distribution into the high-temperature section and the low-temperature section. As one example, an average temperature may be calculated, and then, a section having a temperature greater than the calculated average temperature may be defined as the high-temperature section, and a section having a temperature less than the calculated average temperature may be defined as the low-temperature section.

Alternatively, when a specific temperature is repeatedly measured within a preset error range, a high-temperature portion of the specific temperature may be defined as the high-temperature section, and a low-temperature portion may be defined as the low-temperature section.

Alternatively, excluding a section in which an average temperature change during a preset unit time is more than a preset temperature change from the temperature distribution in operation S105*a*. Therefore, a temperature change section which occurs on a circumference portion of the substrate can be excluded from the temperature distribution. Then, by comparing average temperature of each section with each other, a section having a ratio greater than a preset ratio may be defined as the high-temperature section, and a section having a ratio less than the preset ratio may be defined as the low-temperature section in operation S105*b*.

Referring to FIG. 7, a section having a relatively high temperature of about 710 degrees centigrade or more is denoted by T1, and a section having a relatively low temperature of about 710 degrees centigrade or less is denoted by T2. The sections W1, W2, W3, and W4 except the temperature change section c may be defined as the substrate section, and the sections S1, S2, and S3 except the temperature change section c may be defined as the susceptor section.

Referring again to FIG. 6, a process of matching the susceptor section with the high-temperature section and matching the substrate section with the low-temperature section in the preset substrate displacement angle information may be performed in operation S106.

Figure 8:
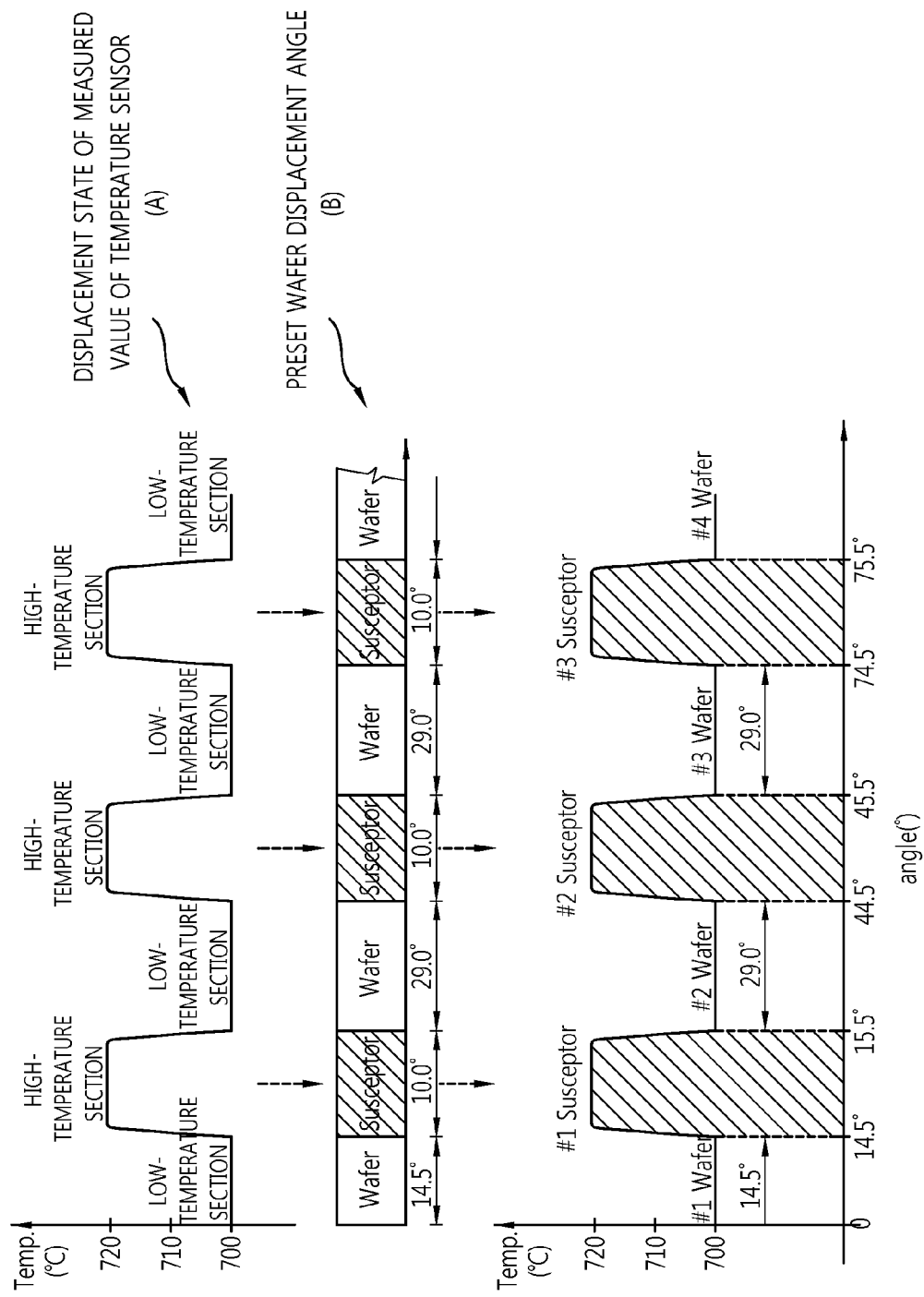
FIG. 8 is a graph illustrating a process of matching a high temperature section and a low temperature section with a susceptor section or a substrate section according to a preset substrate placement angle.

FIG. 8 is a graph illustrating a process of matching a high temperature section and a low temperature section with a susceptor section or a substrate section according to a preset substrate placement angle. There are various matching methods, and one example is illustrated in FIG. 8.

First, as shown in FIG. 8, data in which the low temperature section and the high temperature section are defined is prepared from the measured value of the temperature sensor. Next, as shown in FIG. 8, based on the preset substrate displacement angle, data in which the susceptor section and the substrate section are defined as shown in FIG. 8 is prepared. An angle reference point of the susceptor may be rotated around the rotation shaft thereof at a predetermined angle in a clockwise direction or counterclockwise direction in computer software to approach a displacement angle of the substrate section and the susceptor section to a displacement angle of the high-temperature section and the low-temperature section.

As shown in FIG. 8, One of specific methods of approaching includes placing the substrates in a direction in which a deviation value of an angle between boundary values of the high-temperature sections and the low-temperature sections and boundary values of the susceptor sections and the substrate sections is minimized.

As shown in FIG. 6, the other one of the specific methods of approaching is that the susceptor section or the substrate section is matched with the high-temperature section or the low-temperature section to minimize an average deviation between an angle of a central portion of the susceptor section or the substrate section and an angle of a central portion of the high-temperature section or the low-temperature section.

It may be possible to match more limited specific sections in each section according to a user's set except the central portion of each section.

A process of excluding the temperature change section from the high-temperature section and the low-temperature section may be performed. The temperature change section represents a section in which a temperature is continuously changed on the circumference portion of the substrate (a section denoted by a reference symbol C of FIG. 7).

There are various methods for excluding the temperature change section. As one example, a section in which the average temperature change during the preset unit time is greater than the preset temperature change is excluded from the susceptor section or the substrate section in operation S106b.

After the operation S106, the identifier ID is allotted to each of the susceptor section and the substrate section in operation S107. Then, in operation S109, a heater can be controlled based on a temperature of the section to which the identifier ID selected by a user is allotted. Since a specific section to which the identifier ID is allotted is selected by the user, a section required to be measured by a user may be identified and accurate temperature control is possible.

The selected position may be one of the top surface of the substrate, the surface of the susceptor between the substrates, and a position on the straight line connecting the rotation shaft of the susceptor to of the rotation recognition mark.

As shown in FIG. 7, for example, an object position for adjusting a temperature may be selected from the W1, W2, W3, W4, 51, S2, and S3. The identifier ID may match a specific figure with each of the W1, W2, W3, W4, 51, S2, and S3, or match a specific alphabet with each of the W1, W2, W3, W4, 51, S2, and S3.

When the allotted identifier is selected, the measured temperature is compared to the preset reference temperature in the section corresponding to the selected identifier ID. As a result, when the temperature is low, a power applied to the heater is increased, and when the temperature is high, the power applied to the heater is decreased.

As described above, since the rotation recognition mark and the rotation recognition sensor are used, an actual rotation state of the susceptor may be accurately grasped.

Also, a temperature in a specific section of the susceptor to be required to be measured by the user may be accurately grasped.

Also, the actual rotation state of the susceptor may be measured with high reliability using a relatively simple apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, future modifications to the embodiments of the present invention cannot depart from the technical scope of the present invention.

What is claimed is:

1. A temperature control method for a chemical vapor deposition apparatus, the method comprising:
    detecting a rotation state of a susceptor on which a substrate is loaded on a top surface thereof;
    measuring a temperature of the top surface of the susceptor;
    calculating a temperature distribution of the top surface of the susceptor, based on the detected rotation state and the measured temperature; and
    controlling the temperature of the top surface of the susceptor, based on the calculated temperature distribution
    wherein the calculating of the temperature distribution comprises dividing the temperature distribution into a high-temperature section and a low-temperature section, based on a predetermined temperature,
    wherein the calculation of the temperature distribution of the top surface of the susceptor comprises excluding a temperature change section of a circumference portion of the substrate from the high-temperature section or the low-temperature section.

2. The temperature control method of claim 1, wherein the rotation state comprises a rotation angle of the susceptor or a rotation time of the susceptor.

3. The temperature control method of claim 1, wherein the temperature distribution comprises a temperature distribution for each rotation angle or a temperature distribution for each rotation time.

4. The temperature control method of claim 1, wherein the calculating of the temperature distribution further comprises allotting an identifier to a section of the temperature distribution on the top surface of the susceptor, and the controlling of the temperature of the top surface of the susceptor comprises comparing a temperature of a section to which the identifier selected by a user is allotted with a preset reference temperature to control the temperature of the top surface of the susceptor.

5. The temperature control method of claim 4, wherein the controlling of the temperature of the top surface of the susceptor comprises comparing an average temperature of a section to which the identifier selected by a user is allotted or a real-time temperature with the preset reference temperature to control the temperature of the top surface of the susceptor.

6. The temperature control method of claim 1, wherein the high-temperature section is a section in which the measured temperature is greater by a preset ratio than an average temperature of the top surface of the susceptor, and the low-temperature section is a section in which the measured temperature is less than by a preset ratio than the average temperature of the top surface of the susceptor.

7. The temperature control method of claim 1, further comprising allotting an identifier to each of the high-temperature section and the low-temperature section, and the controlling of the temperature of the top surface of the susceptor comprises comparing the temperature of the section to which the identifier selected by a user is allotted with a preset reference temperature to control the temperature of the top surface of the susceptor.

8. The temperature control method of claim 1, wherein the temperature change section is a section having a temperature change greater than a preset value.

9. The temperature control method of claim 8, wherein the temperature change section is a section in which an average temperature change during a preset time is greater than a preset temperature change.

10. The temperature control method of claim 1, wherein the calculation of the temperature distribution of the top surface of the susceptor comprises matching a susceptor section in substrate displacement information with the high-temperature section based on the inputted substrate displacement information and matching a substrate section in the substrate displacement information with the low-temperature section.

11. The temperature control method of claim 10, wherein the matching of the substrate section comprises matching the substrate section with the low-temperature section to minimize a deviation between an angle of a central portion or a boundary portion of the substrate section and an angle of a central portion or a boundary portion of the low-temperature section.

12. The temperature control method of claim 10, wherein the matching of the susceptor section comprises matching the susceptor section with the high-temperature section to minimize a deviation between an angle of a central portion or a boundary portion of the susceptor section and an angle of a central portion or a boundary portion of the high-temperature section.

* * * * *